(12) United States Patent
Mor

(10) Patent No.: US 9,471,405 B1
(45) Date of Patent: Oct. 18, 2016

(54) METHODS AND SYSTEMS FOR ACCESS TO LEGACY PROGRAMS USING NON-LEGACY INTERFACES

(71) Applicant: OpenLegacy Technologies LTD, Kiryat Ono (IL)

(72) Inventor: Roi Mor, Kiryat Ono (IL)

(73) Assignee: OPENLEGACY TECHNOLOGIES LTD, Kiryat Ono (IL)

( * ) Notice: Subject to any disclaimer, the term of this patent is extended or adjusted under 35 U.S.C. 154(b) by 0 days.

(21) Appl. No.: 14/595,232

(22) Filed: Jan. 13, 2015

Related U.S. Application Data

(60) Provisional application No. 61/926,421, filed on Jan. 13, 2014.

(51) Int. Cl.
| | |
|---|---|
| G06F 3/00 | (2006.01) |
| G06F 9/44 | (2006.01) |
| G06F 9/46 | (2006.01) |
| G06F 13/00 | (2006.01) |
| G06F 9/54 | (2006.01) |
| G06F 17/50 | (2006.01) |

(52) U.S. Cl.
CPC .......... *G06F 9/546* (2013.01); *G06F 17/5009* (2013.01)

(58) Field of Classification Search
None
See application file for complete search history.

(56) References Cited

U.S. PATENT DOCUMENTS

| | | |
|---|---|---|
| 6,697,088 B1 | 2/2004 | Hollander |
| 6,836,780 B1 | 12/2004 | Opitz |
| 2002/0019884 A1* | 2/2002 | Gungabeesoon ............. 709/310 |
| 2009/0241135 A1* | 9/2009 | Wong .................... G06F 9/4443 719/328 |
| 2011/0153530 A1* | 6/2011 | Nachimson ...................... 706/12 |
| 2011/0185340 A1* | 7/2011 | Trent et al. ................... 717/104 |
| 2013/0290932 A1* | 10/2013 | Kruglick ....................... 717/124 |
| 2014/0282627 A1* | 9/2014 | Urdang .......................... 719/328 |
| 2014/0372970 A1* | 12/2014 | Broussard et al. ........... 717/106 |

OTHER PUBLICATIONS

"Jacada Interface Server", Jacada Inc. (6 pages); accessed online at www.jacada.com/products/jacada-interface-server.
"Jacada Integration and Automation Desktop Automation", Jacada Inc. (7 pages), accessed online at www.jacada.com/products/jacada-integration-and-automation.

* cited by examiner

*Primary Examiner* — H S Sough
*Assistant Examiner* — William C Wood
(74) *Attorney, Agent, or Firm* — Matthew M. Hulihan, Esq.; Heslin Rothenberg Farley & Mesiti, PC

(57) ABSTRACT

Development of interfaces for legacy programs. A system includes a client device displaying a series of screens output from a legacy program in a terminal emulator. The system further includes a tracking module logging activity in the terminal emulator in a trail file, and an analysis module adapted to analyze the trail file and produce, based on the analysis, a REST API based upon the analysis that supports a collection of different REST API calls corresponding to the series of screens output from the legacy program. The REST API is a stateless API utilized in a stateful manner in which each REST API call of the collection of REST API calls provides direct access to a corresponding screen of the series of screens.

15 Claims, 8 Drawing Sheets

METHODS AND SYSTEMS FOR ACCESS TO LEGACY PROGRAMS USING NON-LEGACY INTERFACES

CROSS REFERENCE TO RELATED APPLICATIONS

Benefit is claimed to U.S. Provisional Patent Application No. 61/926,421, filed on Jan. 13, 2014; the contents of which are incorporated by reference herein in their entirety.

FIELD OF THE INVENTION

Various exemplary embodiments relate to development of interfaces for legacy programs.

BACKGROUND OF THE INVENTION

Legacy programs are computer programs running on mainframe or host computers. Traditionally these programs are operated through standard terminal screen interfaces, such as the TN3270 screen protocol defined by IBM and others. Many legacy programs are in use throughout the world today. However the character based user interfaces most often employed by legacy programs are perceived as difficult to use by consumers that have become accustomed to graphical user interfaces such as those employed on the WWW, mobile communications device and home computers. In addition, updating of legacy programs with additional business logic has traditionally required many hours of work by human developers.

SUMMARY OF THE INVENTION

A broad aspect of the invention relates to simplifying access to legacy programs.

One aspect of some embodiments of the invention relates to automatic generation of APIs from legacy programs which serve as models for implementation of a web/mobile interface. In some exemplary embodiments of the invention, the API uses metadata (e.g. POJOs) for modeling.

One aspect of some embodiments of the invention relates to automatic generation of a web/mobile interface from APIs describing legacy programs. In some exemplary embodiments of the invention, metadata (e.g. POJOs) from the API serves as a template for the web/mobile interface. Alternatively or additionally, in some embodiments the web/mobile interface is generated automatically in a markup language.

One aspect of some embodiments of the invention relates to direct communication between a client device running a conventional web browser (e.g. Internet Explorer, Chrome, Firefox or Safari) and a host mainframe running a legacy program. In some exemplary embodiments of the invention, a REST API installed in the host mainframe facilitates the direct communication. Optionally, the REST API employs JSON.

It will be appreciated that the various aspects described above relate to solution of technical problems associated with operation of character based legacy programs by users accustomed to graphical user interfaces Alternatively or additionally, it will be appreciated that the various aspects described above relate to solution of technical problems related to provision of graphical user interfaces for character based legacy programs.

In some exemplary embodiments of the invention there is provided a method including: (a) logging activity of a user in a terminal emulator displaying a series of screens output from a legacy program in a trail file stored in a computer hard drive; (b) analyzing the trail file with a screen processor adapted to produce an API; and (c) outputting the API to class files on a hard drive. In some embodiments, the logging includes recording input and output screens displayed in the emulator. Alternatively or additionally, in some embodiments the logging includes logging fields displayed within screens in the emulator. Alternatively or additionally, in some embodiments the analyzing includes assigning a screen type to each of the screens. Alternatively or additionally, in some embodiments the method includes preserving organization of screens in the emulator in the API. Alternatively or additionally, in some embodiments the method includes applying pre-determined rules stored in business rules files to identify patterns on the screens and outputting metadata definitions as part of the API. Alternatively or additionally, in some embodiments the method includes applying pre-determined rules stored in a business rules files to identify relationships between screens displayed in the emulator and output metadata definitions. Alternatively or additionally, in some embodiments the method includes defining screens and/or fields in the legacy program as POJOs in the API. Alternatively or additionally, in some embodiments the method includes testing the API for correctness using the screens processor.

In some exemplary embodiments of the invention there is provided a system including: (a) a client device displaying a series of screens output from a legacy program in a terminal emulator; (b) a tracking module logging activity in the terminal emulator in a trail file; and (c) an analytic module adapted to analyze the trail file and produce an API based upon the analysis. In some embodiments, the tracking module is adapted to log input and output screens displayed in the emulator. Alternatively or additionally, in some embodiments the tracking module is adapted to log fields displayed within screens in the emulator. Alternatively or additionally, in some embodiments the analytic module is adapted preserve organization of screens in the emulator in the API. Alternatively or additionally, in some embodiments the system includes a set of pre-determined rules stored in a business rules files accessible by the analytic module. Alternatively or additionally, in some embodiments the analytic module is adapted to assign a screen type to each of the screens. Alternatively or additionally, in some embodiments the analytic module is adapted to define screens data in the legacy program as POJOs in the API. Alternatively or additionally, in some embodiments the system includes a testing module adapted to test the API for correctness.

In some exemplary embodiments of the invention there is provided a method including: (a) receiving screen buffers as data inputs and (b) rendering a web/mobile application including pages based upon screen models of the screen buffers without pre-generating HTML code. Alternatively or additionally, in some embodiments the pages include menus for navigating to other pages. Alternatively or additionally, in some embodiments the menu provides access to all other screens models, which are accessible from any legacy menu. Alternatively or additionally, in some embodiments the web/mobile application is in a markup language. Alternatively or additionally, in some embodiments each screen model of the screen models corresponds to a URL/API call. Alternatively or additionally, in some embodiments at least one screen model of the screen models includes a widget. Alternatively or additionally, in some embodiments the method includes assigning a URL to each screen model of the web/mobile application.

In some exemplary embodiments of the invention there is provided a system including: (a) an API stored in class files and (b) a rendering engine adapted to render a web/mobile application including pages including form fields corresponding to screen models of the API with each page having a menu providing access to pages. Alternatively or additionally, in some embodiments the menu provides access to all other screens which are accessible from any legacy menu. Alternatively or additionally, in some embodiments rendering engine renders the form fields in a markup language. Alternatively or additionally, in some embodiments each screen model of the screen models corresponds to a URL/API call. Alternatively or additionally, in some embodiments the rendering engine renders at least one of the form fields as a widget.

In some exemplary embodiments of the invention there is provided a method including: (a) transmitting a request from a client device to a mainframe host via an HTTP REST API; and (b) receiving the request at the mainframe host, implementing the request on a legacy program residing on the host and issuing a response to the client device; wherein there is no intervening tier or layer between the client device and the mainframe host. In some embodiments, the method includes installing a REST API service on the mainframe host. Alternatively or additionally, in some embodiments the REST API service employs JSON (JavaScript Object Notation).

In some exemplary embodiments of the invention there is provided a system including: (a) a mainframe host including a REST API communication service and running at least one legacy program and (b) one or more client devices submitting requests directly to the at least one legacy program on the mainframe host without an intervening tier or layer between the client device (s) and the mainframe host. In some embodiments, the REST API employs JSON (JavaScript Object Notation).

Unless otherwise defined, all technical and scientific terms used herein have the same meaning as commonly understood by one of ordinary skill in the art to which this invention belongs. Although suitable methods and materials are described below, methods and materials similar or equivalent to those described herein can be used in the practice of the present invention. In case of conflict, the patent specification, including definitions, will control. All materials, methods, and examples are illustrative only and are not intended to be limiting.

As used herein, the terms "comprising" and "including" or grammatical variants thereof are to be taken as specifying inclusion of the stated features, integers, actions or components without precluding the addition of one or more additional features, integers, actions, components or groups thereof. This term is broader than, and includes the terms "consisting of" and "consisting essentially of" as defined by the Manual of Patent Examination Procedure of the United States Patent and Trademark Office. Thus, any recitation that an embodiment "includes" or "comprises" a feature is a specific statement that sub embodiments "consist essentially of" and/or "consist of" the recited feature.

The phrase "adapted to" as used in this specification and the accompanying claims imposes additional structural limitations on a previously recited component.

The term "method" refers to manners, means, techniques and procedures for accomplishing a given task including, but not limited to, those manners, means, techniques and procedures either known to, or readily developed from known manners, means, techniques and procedures by practitioners of architecture and/or computer science.

Implementation of the method and system according to embodiments of the invention involves performing or completing selected tasks or steps manually, automatically, or a combination thereof. Moreover, according to actual instrumentation and equipment of exemplary embodiments of methods, apparatus and systems of the invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

DEFINITIONS AND ACRONYMS

As used in this specification and the accompanying claims the term "legacy program" indicates an application running on a mainframe or host computer with a non-graphical user interface. Legacy programs are typically written in non-markup languages such as, for example, fortran, cobol, pascal, C+, C++ or basic.

As used in this specification and the accompanying claims the term "API" indicates application program interface.

As used in this specification and the accompanying claims the term "POJO" indicates Plain Old Java Object.

As used in this specification and the accompanying claims the term "terminal emulator" refers to a terminal screen interface such as the IBM TN3270 or similar.

As used in this specification and the accompanying claims the term "HTML" indicates hypertext markup language.

As used in this specification and the accompanying claims the term "URL" indicates unique resource locator.

As used in this specification and the accompanying claims the term "web application" indicates an application executable from a web browser.

As used in this specification and the accompanying claims the term "REST API" indicates representational state transfer API.

As used in this specification and the accompanying claims the term "JSON" indicates Java Script Object Notation.

As used in this specification and the accompanying claims the term "GUI" indicates graphical user interface.

BRIEF DESCRIPTION OF THE DRAWINGS

In order to understand the invention and to see how it may be carried out in practice, embodiments will now be described, by way of non-limiting example only, with reference to the accompanying figures. In the figures, identical and similar structures, elements or parts thereof that appear in more than one figure are generally labeled with the same or similar references in the figures in which they appear. Dimensions of components and features shown in the figures are chosen primarily for convenience and clarity of presentation and are not necessarily to scale. The attached figures are.

DETAILED DESCRIPTION OF EMBODIMENTS

Embodiments of the invention relate to methods and systems associated with use of legacy programs having a character based interface.

Specifically, some embodiments of the invention can be used to automatically create an API based upon a legacy program.

Alternatively or additionally, some embodiments of the invention can be used to automatically produce a web/mobile interface from the API.

Alternatively or additionally, some embodiments of the invention can be used to facilitate direct communication between a client device with a GUI and a legacy program hosted on a mainframe computer.

The principles and operation of methods and/or systems according to exemplary embodiments of the invention may be better understood with reference to the drawings and accompanying descriptions.

Before explaining at least one embodiment of the invention in detail, it is to be understood that the invention is not limited in its application to the details set forth in the following description or exemplified by the Examples. The invention is capable of other embodiments or of being practiced or carried out in various ways. Also, it is to be understood that the phraseology and terminology employed herein is for the purpose of description and should not be regarded as limiting.

Overview

Figure 1A:
FIG. 1a is a screenshot of an exemplary legacy program with character based user interface.

FIG. 1a is a picture of a screen from an exemplary legacy program with character based user interface indicated generally as 99. While such a legacy program can have many advantages, the character based user interface is unfamiliar to many potential users of the program.

Figure 1B:
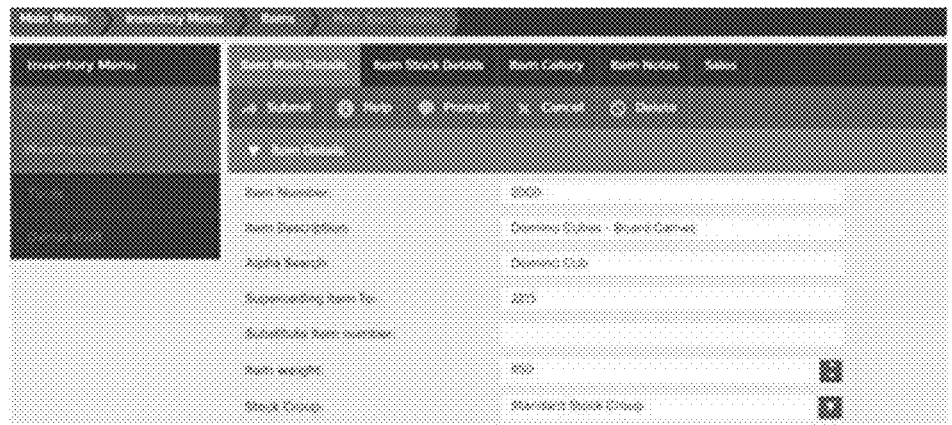
FIG. 1b is a screenshot of a GUI for accessing the exemplary legacy program of FIG. 1a produced according to exemplary embodiments of the invention.

FIG. 1b is a screenshot of a GUI for accessing the exemplary legacy program screen of FIG. 1a indicated generally as 100. Various exemplary embodiments of the invention deal with systems and methods for producing such a GUI in an automated process and/or with a computerized system. In many cases the process involves generation of an API from the legacy program followed by generation of a web/mobile interface from the API. Additional embodiments of the invention relate to installation and use of a REST API service on a mainframe hosting one or more legacy programs. According to these embodiments, the REST API service permits communication between client devices and the mainframe host without an intervening tier or layer.

Exemplary API Generation Method

Figure 2A:
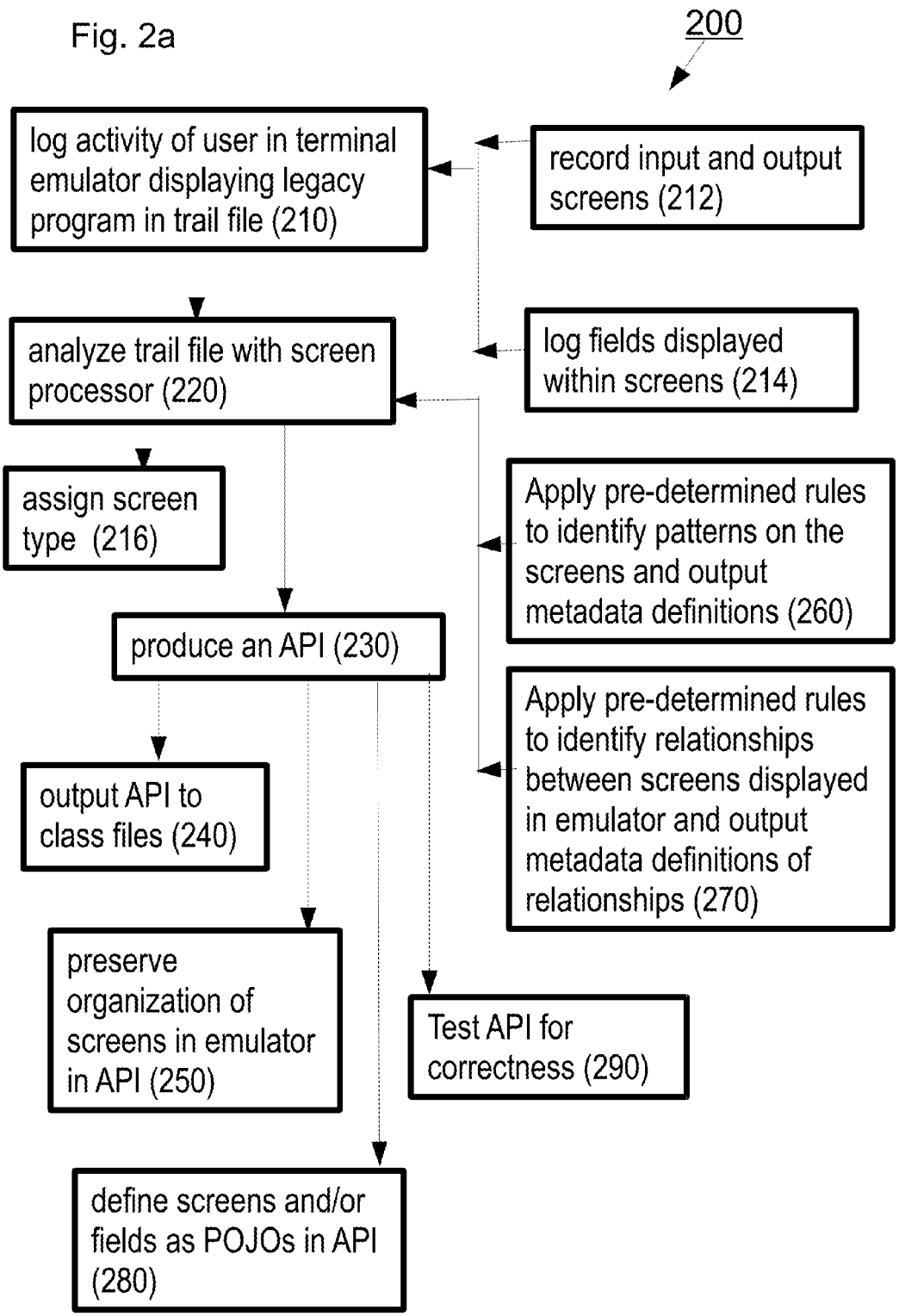
FIG. 2a is a simplified flow diagram of a method according to some exemplary embodiments of the invention.

FIG. 2a is a simplified flow diagram of a method, indicated generally as 200, for production of an API from a legacy program according to some exemplary embodiments of the invention.

Depicted exemplary method 200 includes logging 210 activity of a user in a terminal emulator displaying a series of screens output from a legacy program in a trail file. In some exemplary embodiments of the invention, the trail file is stored in a computer hard drive or other memory device. Depicted method 200 also includes analyzing 220 the trail file with a screen processor adapted to produce 230 an API and outputting 240 the API to class files on a hard drive or other memory device.

In some exemplary embodiments of the invention, logging 210 includes recording 212 input and output screens displayed in the emulator.

Alternatively or additionally, in some embodiments logging 210 includes logging fields 214 displayed within screens in the emulator. Fields may be defined, for example, with specified row and/or column and/or length and/or content and/or colors. Alternatively or additionally, in some embodiments the fields are editable.

In the depicted exemplary embodiment, analyzing 220 includes assigning 216 a screen type to each of said screens. Exemplary screen types include, but are not limited to login, messages, search menus, details, record selection and lookup window.

In some exemplary embodiments of the invention, method 200 includes preserving 250 organization of legacy screens presented in the emulator in the API.

In the depicted exemplary embodiment, analyzing 230 includes applying 260 pre-determined rules to identify patterns on the screens and outputting metadata definitions as part of said API. In some embodiments, the predetermined rules are stored as stored in business rules files.

In the depicted exemplary embodiment, analyzing 230 includes applying 270 pre-determined rules to identify relationships between screens displayed in said emulator and output metadata definitions in the format of API of said relationships. In some embodiments, the pre-determined rules are stored in a business rules files. In some exemplary embodiments of the invention, 260 and/or 270 are performed automatically by computer hardware components.

In the depicted exemplary embodiment, producing 230 the API includes defining 280 screens and/or fields in the legacy program as POJOs in the API.

In some exemplary embodiments of the invention, method 200 includes testing 290 said API for correctness using said screens processor.

Exemplary Rules

Figure 2B:
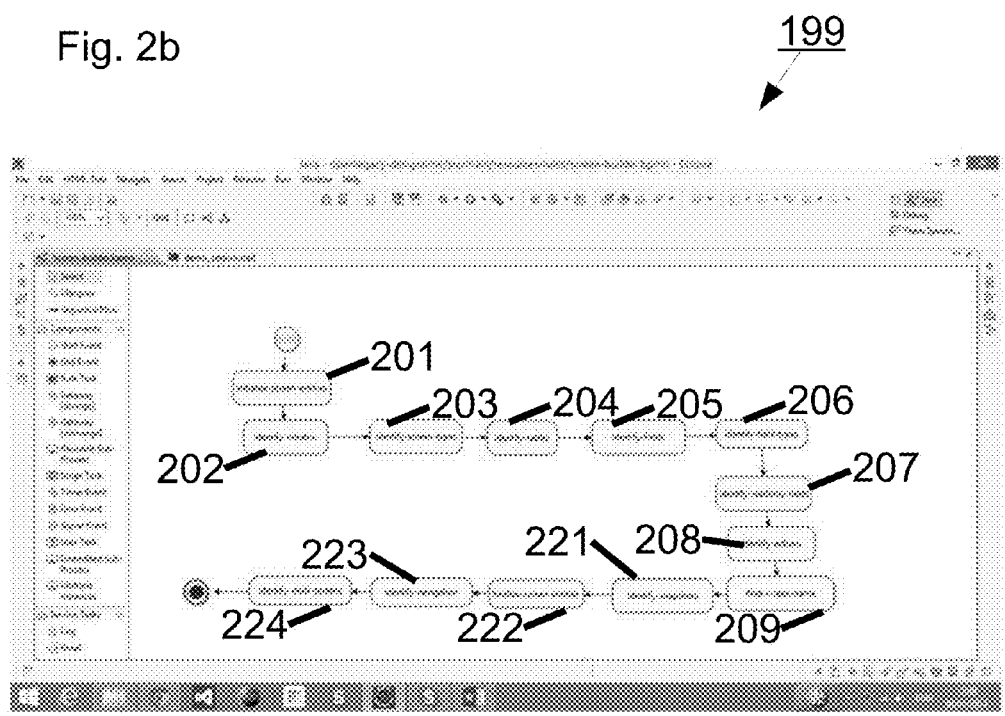
FIG. 2b is a simplified flow diagram depicting implementation of an exemplary set of predetermined rules according to some exemplary embodiments of the invention.

FIG. 2b is a simplified flow diagram, indicated generally as 199, depicting implementation of an exemplary set of predetermined rules according to some exemplary embodiments of method 200.

In some exemplary embodiments of the invention, implementation of the rule set begins with organizing screens (depicted as initialize screen entities 201). Organization into groups relies upon, for example, using screen similarities and picking a representative from each group. This process contributes to a reduction in unwanted duplication.

An additional rule, 202, identifies windows. This can be accomplished, for example by looking for window border/reverse video. In some cases, looking for fields which intercept each other and have specific text pattern (e.g.: + - - - +) serves this purpose. Rule 202 defines an area to look for fields, and prevents defining fields outside the window.

In the figure, the next rule, 203, relates to identification of screen types. While depicted as a single box for clarity, rule 203 is often a Collection of rules to identify screen types (e.g. login, menu, messages).

Rule 204 serves to identify tables (col1, col2) by looking for a collection of columns starting/ending in the same row, which each column s combined with fields starting and ending in the same column. In some embodiments, all fields are removed from the screen (to avoid being recognized as regular fields).

Rule 205 serves to identify fields. In some embodiments, rule 205 finds leftover fields "label: [field]" pattern for both read-only and editable fields, and removes them from the screen. In some embodiments, field types such as date and/or Boolean and/or numeric are handled by rule 205.

In some exemplary embodiments of the invention, rule 206 serves to identify field types. This rule, when implemented, adds data types to each found field in previous step, by predefined patterns (Y/N, Specific date formats, numeric, etc).

Alternatively or additionally, in some embodiments rule 207 identifies read only fields (e.g. "Some Field2"). This rule finds in the leftover fields "label: [RO field]" by specifying more strict regular expression for labels and Read-only field content In the depicted exemplary embodiment, rule 208 serves to identify actions (e.g. "F2=Save"). This rule finds actions on the screen and expresses them as actions metadata.

In some exemplary embodiments of the invention, rule 206 serves to identify key fields, For example, by guessing the 1st numeric RO field.

Alternatively or additionally, in some embodiments rule 209 finds screen names (e.g. "Screen1 title") by looking for a title for the screen in a configurable area and specific regular expression in the leftover fields.

Alternatively or additionally, in some exemplary embodiments of the invention, rule 221 serves to identify screen by looking for screen name and identifier fields (constants) with specific regular expression in the leftover fields.

At 222 screen entities defined by the above rules are finalized in some embodiments.

Rule 223 identifies navigation steps between the selected screens by recognizing the typed content on the matching output screen. In some embodiments, this includes drill-down recognition inside a table.

Rule 224 identifies child screens by finding child relations between entities and fields and associates them as child entities (to create composite API for screens).

In some embodiments, there is an additional rule (not depicted) which identifies lookup screens by finding relations between a field and his lookup window for values, and creates a relation between the field and the window screen, such that exposing the field possible values from the screen is enabled.

Exemplary API Generation System

Figure 3:
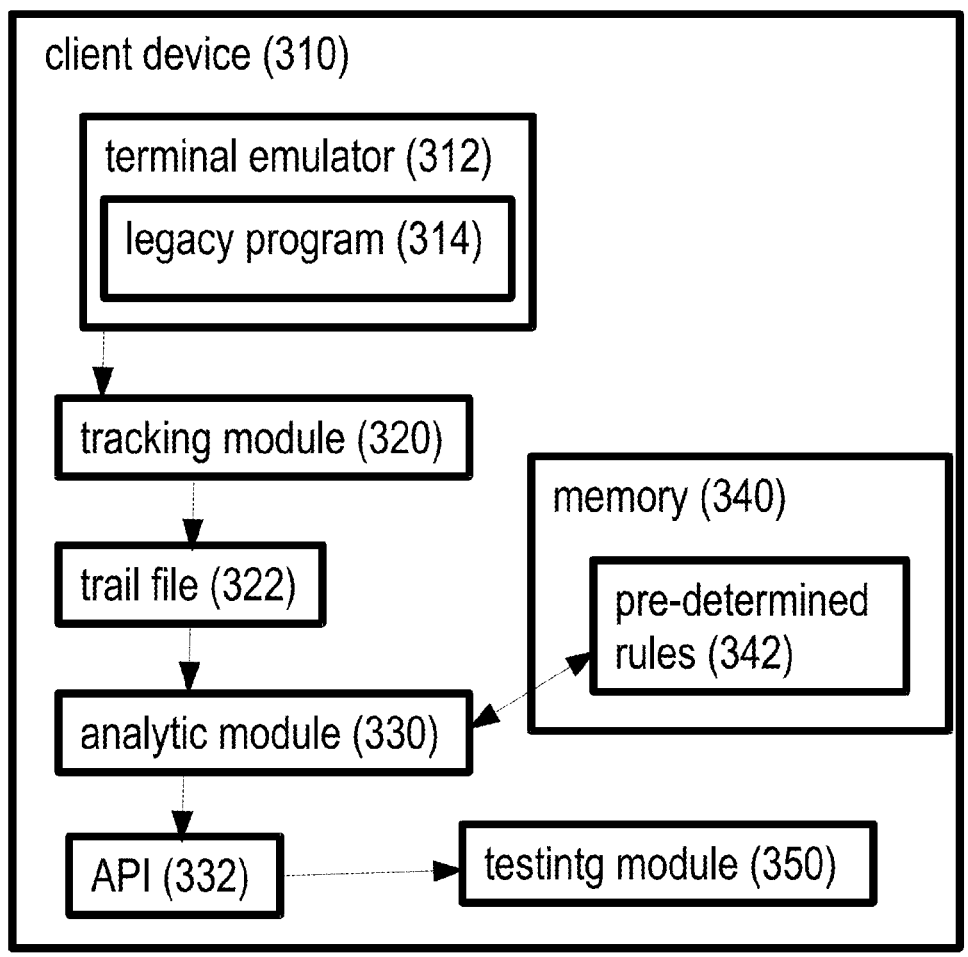
FIG. 3 is a schematic representation of a system according to some exemplary embodiments of the invention.

FIG. 3 is a schematic representation of a system, indicated generally as 300, for production of an API from a legacy program according to some exemplary embodiments of the invention.

Depicted exemplary system 300 includes a client device 310 displaying a series of screens output from a legacy program 314 in a terminal emulator 312 and a tracking module 320 logging activity in terminal emulator 312 in a trail file 322. In some embodiments, system 300 includes an analytic module 330 adapted to analyze trail file 322 and produce an API 332 based upon the analysis. In some embodiments, tracking module 320 is adapted to log input and output screens displayed in emulator 312. Alternatively or additionally, in some embodiments tracking module 320 is adapted to log fields displayed within screens in emulator 312. Alternatively or additionally, in some embodiments analytic module 330 is adapted preserve organization of screens in emulator 312 in API 332.

In some exemplary embodiments of the invention, system 300 includes a set of pre-determined rules 342 stored in a memory 340 (e.g. as one or more business rules files) accessible by analytic module 330. As described hereinabove, rules 341 identify patterns and/or relationships between screens and/or on the screens displayed in emulator 312. In some exemplary embodiments of the invention, analytic module 330 outputs metadata definitions of these patterns as part of API 332.

In some exemplary embodiments of the invention, analytic module 330 is adapted to assign a screen type to each of the screens in emulator 312. Alternatively or additionally, in some embodiments analytic module 330 is adapted to define screens data in legacy program 314 as POJOs in API 332.

In the depicted exemplary embodiment, system 300 includes a testing module 350 adapted to test API 332 for correctness.

Exemplary Annotation Language

In some exemplary embodiments of the invention, POJOs are used to define screen entities. This annotation system contributes to an ability to access a legacy program via a standard Java API. According to this strategy, simple java classes define fields. This approach involves analysis and re-mapping of only user interface objects [iputs/outputs/menus/windows/tables]

A POJO is a simple Java class without any special code, and just Java fields declarations and get/set methods.

Generation of POJO based annotation includes creating a Java class which contains "@ScreenEntity" annotation.

"@ScreenIndentifiers" annotation is added. The annotation contains static content on the screen which identifies a legacy screens into a specific class and assigns a title to a plaintext screen.

In some embodiments "@ScreenNavigation" annotation is added to indicate what is the screen entity which this screen is accessed from, and with what terminal action. This notation defines relationships between screens Together these notations permit navigation from any screen to any screen.

In some embodiments, Java fields are added to the class, each mapped to a position on the screen by row and column.

Popular data types such as List<SomeTableRecord>, Boolean, Integer, Date, Enum are all supported. Use of these data types enables simpler type safety relative to the plain text (character based) legacy program.

Some embodiments employ additional annotation for formatting to each type (@ScreenTable and/or @ScreenBooleanField and/or @ScreenDateField)

In some exemplary embodiments of the invention, a hidden Java class is generated (called Aspect), which contains get/set methods for each field, and additional fields (focus field), to avoid manual writing of the get/set methods.

Alternatively or additionally, in some embodiments multiple Java classes are created in a similar manner, each class containing unique identifiers, fields and navigation settings.

Exemplary API

Using the annotation system described above, an API according to an exemplary embodiment of the invention has a format in the following style:

```
@ScreenEntity
@ScreenIdentifiers (identifiers= (@Indetifier (row=1, coloun=5,
value="Screen1 title"))
    @ScreenNavigation    (accessedFrom=SomeMenuScreen.class,
assignedFields (fields= {@AssignField (name="menuSelection",
value="1"), terminalAction=ENTER.class})
    public class SomeScreen1 {
        @ScreenField (row=2, column=15, displayName="Some Field1",
editable=true)
        private String someField1;
        @ScreenField (row=3, column=15, displayName="Some Field2")
        private String someField2;
        private List<SomeTableRecord1> someTableRecords;
        @ScreenTable (startRow=6, endRow=7)
        public static class SomeTableRecord1 {
            ScreenColumn (startColumn=3, endColumn=4)
            private Integer column1;
            ScreenColumn (startColumn=10, endColumn=18)
            private String column2;
        }
    }
  1 3 5 7 9 11 14 17 20..
  ---------------------------
  1 | Screen1 title |
  2 | SomeField1: ___ |
  3 | SomeField2: 482 |
  4 | |
  5 | col1 | col2 |
  6 | 12 customer1 |
  7 | 22 customer1 |
  . ---------------------------
```

Exemplary Application Generation Method

Figure 4:
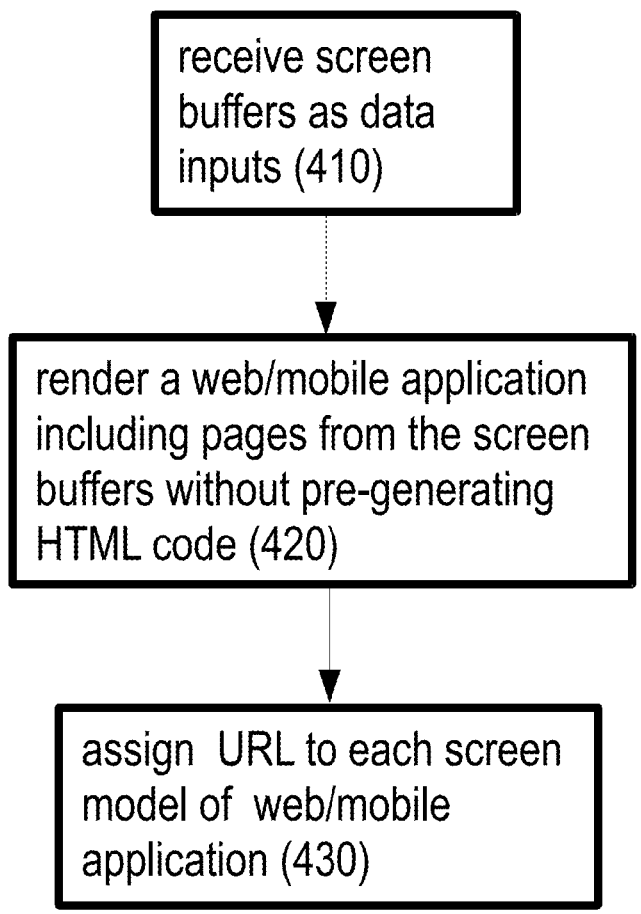
FIG. 4 is a simplified flow diagram of a method according to additional exemplary embodiments of the invention.

FIG. 4 is a simplified flow diagram of a method, indicated generally as 400, for generating a web/mobile application according to additional exemplary embodiments of the invention.

In the depicted exemplary embodiment, method 400 includes receiving 410 screen buffers as data inputs. In some exemplary embodiments of the invention, the screen buffers correspond to API 332 of FIG. 3. Depicted method 400 also includes rendering 420 a web/mobile application comprising pages based upon screen models of the screen buffers. In some exemplary embodiments of the invention, rendering 420 is performed without pre-generating HTML code. In some exemplary embodiments of the invention, the pages of the web/mobile application include menus for navigating to other pages. In some exemplary embodiments of the invention, the menus provide access to all other screens buffers, which are accessible from any legacy menu. Alternatively or additionally, in some embodiments the web/mobile application is in a markup language (e.g. HTML). In some exemplary embodiments of the invention, each screen model of the screen models corresponds to a URL/API call. Alternatively or additionally, in some embodiments least one screen model of the screen models comprises a widget (e.g.: String presented as textbox, numeric presented as spinner, date presented as calendar, Boolean presented as Checkbox and/or radio button, List presented as table, enumeration presented as dropdown menu).

In some exemplary embodiments of the invention, method 400 includes assigning 430 a URL to each screen model of said web/mobile application. In some embodiments, assigning a URL makes the web/mobile application more easily accessible by the application users.

Exemplary Screen Model Types

Many legacy programs have common features which can serve as the basis for screen models. Several of these common features are listed here by way of example A screen model of a "login" screen containing fields of type: user, password and error message.

Some screen models contain one or more "menus" with menu selection field. Some screen models are "applicative" and contain fields with the relevant data type (e.g. string and/or numeric and/or Boolean and/or date and/or enumeration and/or list and/or radio buttons).

In some embodiments, screen models define how they are accessible via a "menu" screen or other "applicative" screen model, and what assigned fields (to the menu entries).

In some embodiments, screen models a primary key, and defines how to access the screen by key (table drilldown or search).

Alternatively or additionally, in some embodiments screen models contain "actions" definition which defines the possible actions (via F keys).

Alternatively or additionally, in some embodiments a screen model defines one or more "child" screen models. Each "child" defines access from the containing (parent) screen.

Once the relevant screen models are loaded into memory, they are organized (for example) as follows: The "Login" screen model is displayed a predefined login web/mobile page, corresponding to the $1^{st}$ legacy screen. Remaining screen models are organized as tree model according to their respective accessibility definitions. "Applicative" screen models which are accessible from "menu" screens are leaves of the tree, and all the menus which are accessible from other menus are nodes. In some embodiments, the root node is the menu which has no accessibility definition.

For each screen model, the system traces its route from the model itself to the root menu using the accessibility definitions, and stores the route in memory, as a navigation hierarchy for the screen model.

In some embodiments, rendering 420 occurs dynamically using the following rules: The root URL shows a predefined login page (user, password, error, submit). The login page invokes the API, and performs login via the login model. In case the next model is still login, there is a in the form of an error message, in other cases a predefined menu page is displayed. In some embodiments, the predefined menu page contains a fixed side bar menu rendered from the menu tree. According to these embodiments each leaf is displayed as a URL for the model name.

In some embodiments, each link from the menu leads to an auto rendered page. Some of or all of these auto rendered pages are for an "applicative" mode. Applicative models have some or all of the following elements:

a navigation hierarchy show (e.g. on the top of the page) as breadcrumb showing the location in the application;

a fixed side menu allowing direct access to each application screen model;

a tab system indicating child screen models (if any). For example, n some embodiments the $1^{st}$ tab shows the parent model, and the $2^{nd}$ and subsequent tabs display child screen models;

a toolbar containing all the model/s actions for the page (or for each tab if child screen models are present);

auto-displayed graphical panels including a group of neighbor fields of the screen model, defined by the original row and column for each field; and fields within a panel represented as widgets.

Each action in the toolbar invokes the matching legacy action, and returns a new screen model, which is auto displayed by the system in the same manner.

In some embodiments, a logoff button is provided to disconnect from the legacy program. Alternatively or additionally, in some embodiments of the invention closing of a browser window disconnects from the legacy program.

Exemplary Application Generation System

Figure 5:
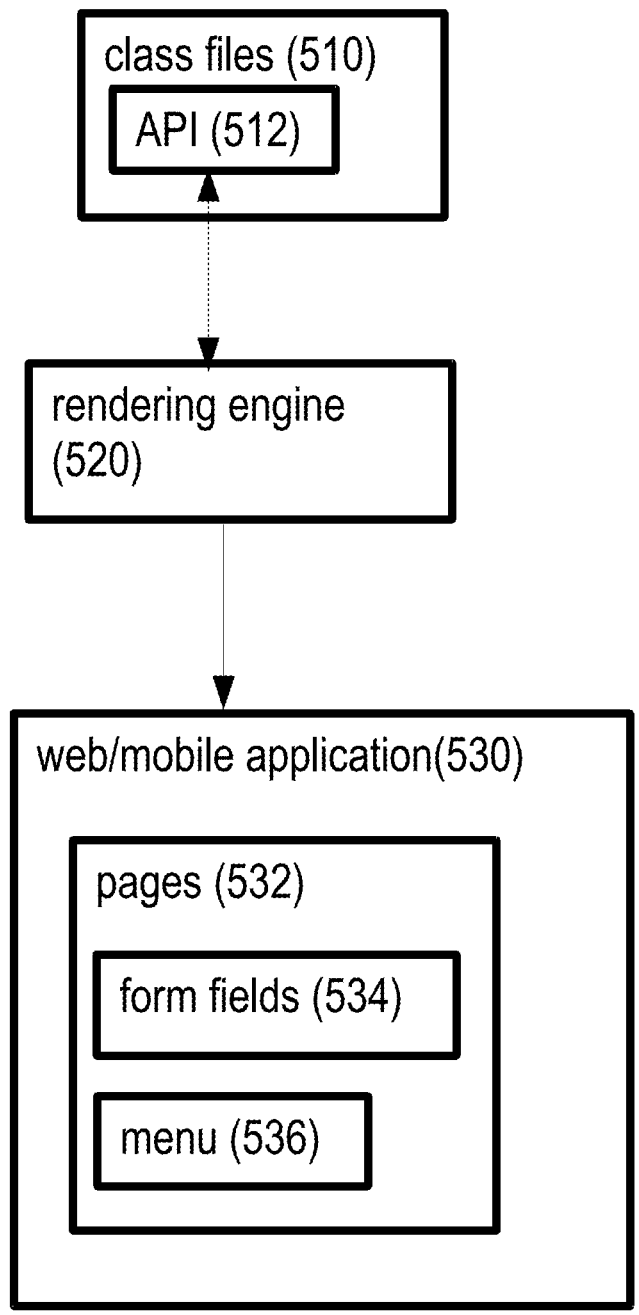
FIG. 5 is a schematic representation of a system according to additional exemplary embodiments of the invention.

FIG. 5 is a schematic representation of a system, indicated generally as 500, for generation of a web/mobile application according to additional exemplary embodiments of the invention.

Depicted exemplary system 500 includes an API 512 stored in class files 510. In some exemplary embodiments of the invention, storage of class files 510 is on a hard drive or other memory device.

Depicted exemplary system 500 also includes a rendering engine 520 adapted to render a web/mobile application 530 comprising pages 532 (only 1 page is depicted for clarity) including form fields 534 (only 1 form field is depicted for clarity) corresponding to screen models of API 512 with each page 532 having a menu 536 providing access to other pages 532. In some exemplary embodiments of the invention, menus 536 are already present in API 512. In some embodiments, menu 536 provides access to all other screens (corresponding to pages 536) which are accessible from any legacy menu. Alternatively or additionally, in some embodiments rendering engine 520 renders said form fields in a markup language (e.g. HTML). Alternatively or additionally, in some embodiments each screen model of said screen models corresponds to a URL/API call (e.g. login and/or applicative). Alternatively or additionally, in some embodiments rendering engine 520 renders at least one of form fields 534 as a widget.

Exemplary Direct Communication Method

Figure 6:
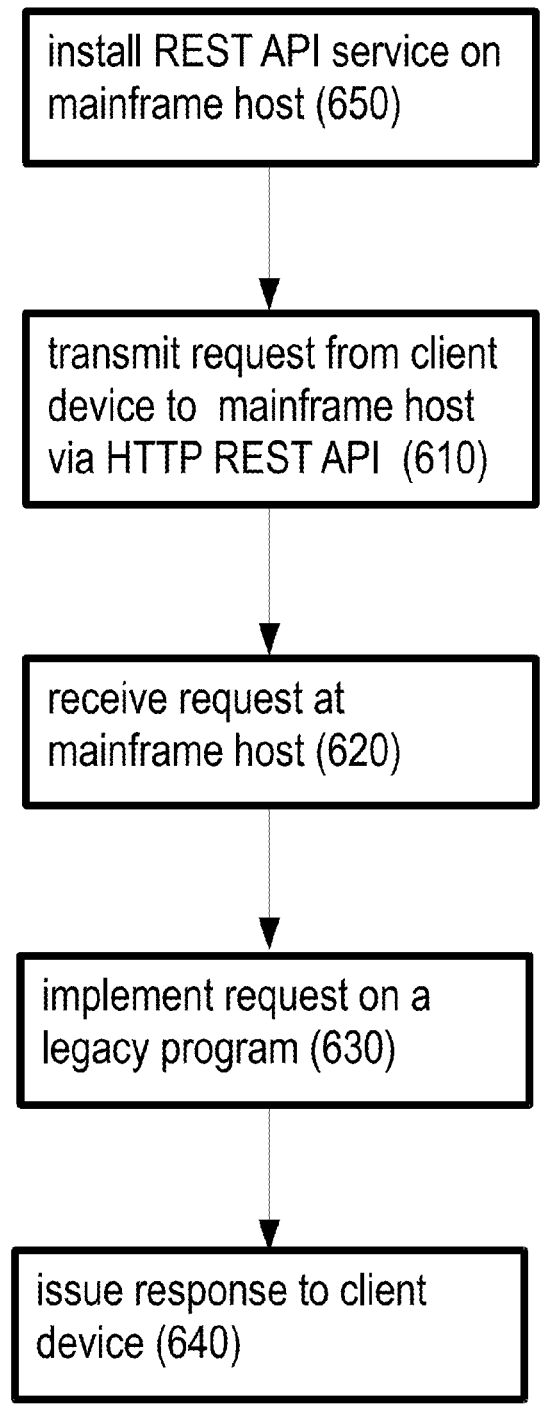
FIG. 6 is a simplified flow diagram of a method according to further additional exemplary embodiments of the invention.

FIG. 6 is a simplified flow diagram of a method, indicated generally as 600, for direct communication between a client device and a mainframe host according to further additional exemplary embodiments of the invention. Direct communication in this context indicates submission of HTTP (or HTTPS) requests from a web browser on the client device to the mainframe host.

Depicted exemplary method 600 includes transmitting 610 a request from a client device to a mainframe host via an HTTP REST API and receiving 620 the request at the mainframe host, implementing 630 the request on a legacy program residing on said host and issuing 640 a response to the client device. In some exemplary embodiments of the invention, there is no intervening tier or layer between the client device and the mainframe host.

In some exemplary embodiments of the invention, method 600 includes installing 650 a REST API service on the mainframe host. In some embodiments, the REST API service employs JSON (JavaScript Object Notation).

Exemplary Direct Communication System

Figure 7:
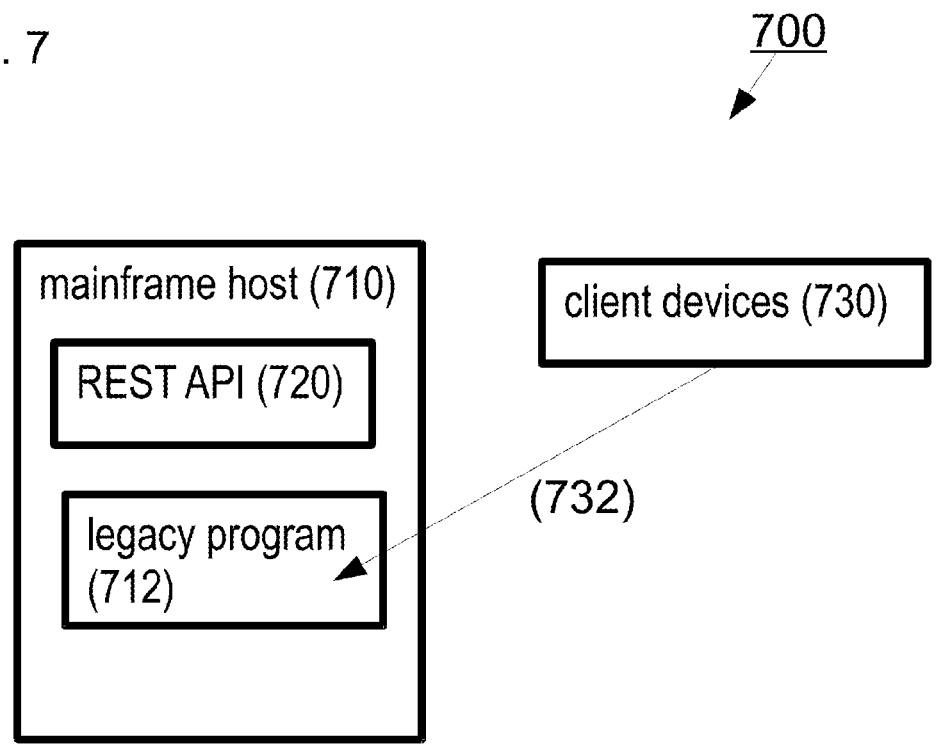
FIG. 7 is a schematic representation of a system according to further additional exemplary embodiments of the invention.

FIG. 7 is a schematic representation of a system for direct communication between a client device and a mainframe host, indicated generally as 700, according to further additional exemplary embodiments of the invention.

Depicted exemplary system 700 includes a mainframe host 710 comprising a REST API communication service 720 and running at least one legacy program 712 and one or more client devices 730 (one is pictured for clarity) submitting requests 732 directly to said at least 1 legacy program on said mainframe host without an intervening tier or layer between client device (s) 730 and mainframe host 710. In some embodiments, REST API service 720 employs JSON (JavaScript Object Notation).

In some embodiments, requests 732 employ JavaScript.

One result of system 700 and/or method 600 is that legacy programs become accessible from standard web browsers operating on computers, tablet devices or mobile communications devices.

It is expected that during the life of this patent many new communications protocols will be developed and the scope of the invention is intended to include all such new technologies a priori.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

Specifically, a variety of numerical indicators have been utilized. It should be understood that these numerical indicators could vary even further based upon a variety of engineering principles, materials, intended use and designs incorporated into the various embodiments of the invention. Additionally, components and/or actions ascribed to exemplary embodiments of the invention and depicted as a single unit may be divided into subunits. Conversely, components and/or actions ascribed to exemplary embodiments of the invention and depicted as sub-units/individual actions may be combined into a single unit/action with the described/depicted function.

Alternatively, or additionally, features used to describe a method can be used to characterize an apparatus and features used to describe an apparatus can be used to characterize a method.

It should be further understood that the individual features described hereinabove can be combined in all possible combinations and sub-combinations to produce additional embodiments of the invention. The examples given above are exemplary in nature and are not intended to limit the scope of the invention which is defined solely by the following claims.

Each recitation of an embodiment of the invention that includes a specific feature, part, component, module or process is an explicit statement that additional embodiments not including the recited feature, part, component, module or process exist.

Specifically, the invention has been described in the context of legacy programs hosted on mainframe computers but might also be used in conjunction with applications having a character based interface on older desktop computers.

All publications, references, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The terms "include", and "have" and their conjugates as used herein mean "including but not necessarily limited to".

I claim:

1. A system comprising:
   (a) a client device displaying a series of screens output from a legacy program in a terminal emulator;

(b) a tracking module logging activity in said terminal emulator in a trail file; and (c) an analytic module adapted to analyze said trail file and produce, based on the analysis, a REST API that supports a collection of different REST API calls corresponding to the series of screens output from the legacy program, the REST API being a stateless API utilized in a stateful manner in which each REST API call of the collection of REST API calls provides direct access to a corresponding screen of the series of screens.

2. A system according to claim 1, wherein said tracking module is adapted to log input and output screens displayed in said emulator.

3. A system according to claim 1, wherein said tracking module is adapted to log fields displayed within screens in said emulator.

4. A system according to claim 1, wherein said analytic module is adapted to preserve organization of screens in said emulator in said REST API.

5. A system according claim 1, further comprising a set of pre-determined rules stored in a business rules files accessible by said analytic module.

6. A system according to claim 1, wherein said analytic module is adapted to assign a screen type to each of said series of screens.

7. A system according to claim 1, wherein said analytic module is adapted to define screens data in said legacy program as POJOs (Plain Old Java Objects) in said REST API.

8. A system according to claim 1, further comprising a testing module adapted to test said REST API for correctness.

9. A system comprising:

(a) a REST API stored in class files, the REST API supporting a collection of different REST API calls corresponding to a series of screens output from a legacy program, the REST API being a stateless API utilized in a stateful manner in which each REST API call of the collection of REST API calls provides direct access to a corresponding screen of the series of screens; and (b) a rendering engine adapted to render a web/mobile application comprising pages including form fields corresponding to screen models of said REST API with each page having a menu providing access to pages.

10. A system according to claim 9, wherein said menu provides access to all other screens which are accessible from any legacy menu.

11. A system according to claim 9, wherein said rendering engine renders said form fields in a markup language.

12. A system according to claim 9, wherein each screen model of said screen models corresponds to a respective REST API call of the collection of REST API calls.

13. A system according to claim 9, wherein said rendering engine renders at least one of said form fields as a widget.

14. A system comprising:

(a) a mainframe host comprising a REST API communication service and running at least one legacy program, the REST API communication service providing a REST API corresponding to the at least one legacy program, the REST API supporting a collection of different REST API calls corresponding to a series of screens output from the at least one legacy program, the REST API being a stateless API utilized in a stateful manner in which each REST API call of the collection of REST API calls provides direct access to a corresponding screen of the series of screens; and (b) one or more client devices submitting requests directly to said at least one legacy program on said mainframe host without an intervening tier or layer between said client device (s) and said mainframe host.

15. A system according to claim 14, wherein said REST API employs JSON (JavaScript Object Notation).

\* \* \* \* \*